(12) United States Patent
Nishida et al.

(10) Patent No.: US 11,803,082 B2
(45) Date of Patent: Oct. 31, 2023

(54) BACKLIGHT UNIT AND DISPLAY APPARATUS COMPRISING SAME

(71) Applicant: SAMSUNG ELECTRONICS CO., LTD., Suwon-si (KR)

(72) Inventors: Yasuhiro Nishida, Suwon-si (KR); Farid Mukhtarov, Suwon-si (KR); Daesik Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/979,926

(22) Filed: Nov. 3, 2022

(65) Prior Publication Data

US 2023/0053454 A1    Feb. 23, 2023

Related U.S. Application Data

(63) Continuation of application No. PCT/KR2021/006993, filed on Jun. 4, 2021.

(30) Foreign Application Priority Data

Jul. 20, 2020   (KR) ..................... 10-2020-0089873

(51) Int. Cl.
*G02F 1/00*     (2006.01)
*G02F 1/13357*  (2006.01)
(Continued)

(52) U.S. Cl.
CPC .. *G02F 1/133605* (2013.01); *G02F 1/133562* (2021.01); *G02F 1/133603* (2013.01);
(Continued)

(58) Field of Classification Search
CPC ......... G02F 1/133605; G02F 1/133612; G02F 1/133562; G02F 1/133603; H05K 1/0274;
(Continued)

(56) References Cited

U.S. PATENT DOCUMENTS 7,834,952 B2   11/2010  Lee et al.
8,128,273 B2   3/2012   Pijlman et al.
(Continued)

FOREIGN PATENT DOCUMENTS

JP   2019-129066 A    8/2019
KR   10-2005-0121076 A   12/2005
(Continued)

OTHER PUBLICATIONS

International Search Report issued in International Application No. PCT/KR2021/006993 dated Sep. 29, 2021.
(Continued)

*Primary Examiner* — Gerald J Sufleta, II
(74) *Attorney, Agent, or Firm* — STAAS & HALSEY LLP (57) ABSTRACT

A backlight unit comprising a printed circuit board; a plurality of light sources at a surface of the printed circuit board, the plurality of light sources to emit light; and a reflective sheet, arranged above the plurality of light sources, having differing transmittance on the basis of incident angle of the light from the plurality of light sources, respectively, wherein the reflective sheet is provided with at least one gap between two adjacent light sources from among the plurality of light sources.

13 Claims, 10 Drawing Sheets

(51) Int. Cl.
  *G02F 1/1335* (2006.01)
  *H05K 1/02* (2006.01)
  *H05K 1/18* (2006.01)

(52) U.S. Cl.
  CPC ..... *G02F 1/133612* (2021.01); *H05K 1/0274* (2013.01); *H05K 1/181* (2013.01); *H05K 2201/10106* (2013.01); *H05K 2201/2054* (2013.01)

(58) Field of Classification Search
  CPC ......... H05K 1/181; H05K 2201/10106; H05K 2201/2054
  See application file for complete search history.

(56) References Cited

U.S. PATENT DOCUMENTS

| | | | |
|---|---|---|---|
| 9,897,266 B2 | 2/2018 | Moon et al. | |
| 10,871,607 B2 | 12/2020 | Yasunaga et al. | |
| 2005/0280756 A1 | 12/2005 | Kim et al. | |
| 2007/0159573 A1 | 7/2007 | Lee et al. | |
| 2012/0188759 A1* | 7/2012 | Sato | G02F 1/133603 362/230 |
| 2014/0092630 A1* | 4/2014 | Franklin | G02B 6/009 362/609 |
| 2015/0124434 A1* | 5/2015 | Chang | G02F 1/133605 362/97.3 |
| 2016/0061414 A1 | 3/2016 | Song et al. | |
| 2016/0259209 A1* | 9/2016 | Ito | G02F 1/133611 |
| 2017/0160591 A1* | 6/2017 | Cho | G02F 1/133606 |
| 2017/0261161 A1 | 9/2017 | Moon et al. | |
| 2018/0239197 A1* | 8/2018 | Yamano | G02F 1/133611 |
| 2018/0321557 A1* | 11/2018 | Pelka | G02F 1/133606 |
| 2019/0094616 A1* | 3/2019 | Kim | G02B 6/0051 |
| 2019/0227221 A1 | 7/2019 | Yasunaga et al. | |
| 2019/0271884 A1* | 9/2019 | Watanabe | G02F 1/133602 |
| 2021/0033930 A1* | 2/2021 | Lee | G02F 1/133606 |
| 2021/0088852 A1* | 3/2021 | Kim | G02F 1/133603 |
| 2021/0349352 A1* | 11/2021 | Ito | G02F 1/133611 |
| 2022/0206337 A1 | 6/2022 | Kim et al. | |

FOREIGN PATENT DOCUMENTS

| | | |
|---|---|---|
| KR | 10-2007-0074951 A | 7/2007 |
| KR | 10-2007-0080030 A | 8/2007 |
| KR | 10-2009-0119393 A | 11/2009 |
| KR | 10-0939191 B1 | 1/2010 |
| KR | 10-2011-0065043 A | 6/2011 |
| KR | 10-2014-0011080 A | 1/2014 |
| KR | 10-2015-0134151 A | 12/2015 |
| KR | 10-2017-0050725 A | 5/2017 |
| KR | 10-2017-0106575 A | 9/2017 |
| KR | 10-2021-0037979 A | 4/2021 |
| WO | WO 2021/066329 A1 | 4/2021 |

OTHER PUBLICATIONS

International Written Opinion issued in International Application No. PCT/KR2021/006993 dated Sep. 29, 2021.

* cited by examiner

BACKLIGHT UNIT AND DISPLAY APPARATUS COMPRISING SAME

CROSS-REFERENCE TO RELATED APPLICATION

This application is a continuation application, under 35 U.S.C. § 111(a), of international application No. PCT/KR2021/006993, filed on Jun. 4, 2021, which claims priority under 35 U.S.C. § 119 to Korean Patent Application No. 10-2020-0089873, filed on Jul. 20, 2020, the disclosures of which are incorporated herein by reference in their entirety.

BACKGROUND

Field

The disclosure relates to a backlight unit and a display apparatus comprising the same. More particularly, the disclosure relates to a backlight unit provided with an improved structure to improve brightness efficiency and brightness uniformity and to prevent a Mura phenomenon and a display apparatus comprising the same.

Description of Related Art

In general, a display apparatus, which is a type of an output device that receives an image signal and displays an image on a screen, is used in various fields such as a home or a business place.

Because a liquid crystal display (LCD) device from among the display apparatuses cannot emit light on its own, a backlight unit (BLU) is used as a light source. Recently, the backlight unit may adopt a direct type rather than an edge type because light efficiency is high and manufacturing cost of a light guide panel can be reduced.

However, in the case of a direct type backlight unit, brightness can be distributed unevenly throughout a whole screen, and there is a problem of Mura which is a stain according to a darkness portion, a brightness portion, color, or the like occurring.

SUMMARY

According to an embodiment, a backlight unit includes a printed circuit board, a plurality of light sources at a surface of the printed circuit board, the plurality of light sources to irradiate light, and a reflective sheet that faces the plurality of light sources, the reflective sheet having differing transmittance according to a light incident angle of light from the plurality of light sources, respectively, and the reflective sheet has at least one void between two adjacent light sources among the plurality of light sources.

The reflective sheet may include the at least one void where a total area of the at least one void may be greater than or equal to 5% and less than or equal to 50% of an area of the reflective sheet.

The at least one void may be at least one hole among a plurality of holes which is formed through the reflective sheet.

The plurality of holes may be randomly disposed on the reflective sheet.

At least one hole among the plurality of holes may have a size different from at least another hole among the plurality of holes.

A pitch between the plurality of holes may be smaller than a pitch between the plurality of light sources.

A number of the plurality of holes may be greater than a number of the plurality of light sources.

Diameters of the plurality of holes may be greater than or equal to 0.05 mm and less than or equal to 5 mm.

A pitch between the plurality of holes may be greater than or equal to 0.1 mm and less than or equal to 10 mm.

The reflective sheet may have a plurality of reflection regions having a respective differing transmittance according to a respective light incident angle, the at least one void may be a slit region between the plurality of reflection regions, and the slit region may have a whereby of at least one portion is between the two adjacent light sources among the plurality of light sources.

The plurality of reflection regions may have a circular or a polygonal form.

The reflective sheet may include a polyethylene terephthalate (PET) film which supports the plurality of reflection regions.

The reflective sheet may have a reflectivity greater than a transmittance based on the light incident angle being less than a preset value.

The reflective sheet may be formed by laminating a plurality of thin films with at least one from among a refractive index and a thickness being different.

The printed circuit board may have a reflective layer which reflects light toward an upper side of the surface on which the plurality of light sources are disposed.

According to an embodiment, a display apparatus includes a display panel, and a backlight unit at a lower part of the display panel, and the backlight unit includes a printed circuit board, a plurality of light sources at a surface of the printed circuit board, the plurality of light sources to irradiate light, and a reflective sheet that faces the plurality of light sources, the reflective sheet having differing transmittance according to a light incident angle of light from the plurality of light sources, and the reflective sheet has at least one void between two adjacent light sources among the plurality of light sources.

The display apparatus may further include a quantum dot sheet disposed between the display panel and the backlight unit and which converts a wavelength of light.

The reflective sheet may include the void, a total area of the void may be greater than or equal to 5% and less than or equal to 50% of an area of the reflective sheet.

The void may be a plurality of holes which passes through the reflective sheet.

The reflective sheet may include a plurality of reflection regions having a respective differing transmittance according to a respective light incident angle, the void may be a slit region between the plurality of reflection regions, and the slit region may have a pattern whereby at least one portion is between two adjacent light sources among the plurality of light sources.

DETAILED DESCRIPTION

Embodiments described below are example embodiments to assist in the understanding of the disclosure, and it is to be understood that the disclosure may be variously modified and implemented differently from the embodiments described herein. However, in describing the disclosure, in case it is determined that the detailed description of related known technologies may unnecessarily confuse the gist of the disclosure, the detailed description thereof and a detailed illustration will be omitted. In addition, the accompanied drawings are not illustrated to its actual scale, but may be shown exaggerated in size of some elements to assist in the understanding of the disclosure.

Terms used in describing the various embodiments of the disclosure are general terms selected considering their function herein. However, the terms may change depending on intention, legal or technical interpretation, emergence of new technologies, and the like of those skilled in the related art. In addition, there may be terms arbitrarily selected. In this case, the meaning of the term may be interpreted according to the meaning defined in the disclosure, and the terms used herein are to be interpreted based on the overall context of the disclosure and the technical common sense according to the related art.

In the disclosure, expressions such as "have," "may have," "include," "may include," or the like are used to designate a presence of a corresponding characteristic (e.g., elements such as numerical value, function, operation, or component), and not to preclude a presence or a possibility of additional characteristics.

Further, in the disclosure, because elements necessary in describing each embodiment of the disclosure are described, and the disclosure is not necessarily limited thereto. Accordingly, some elements may be modified or omitted, and other elements may be added. In addition, elements may be distributed and disposed in independent devices different from one another.

Furthermore, although embodiments of the disclosure are described with reference to the accompanying drawings and descriptions described in the accompanying drawings below, the disclosure is not limited to or limited by the embodiments.

Aspects of the disclosure are to address at least the above-mentioned problems and/or disadvantages and to provide a backlight unit provided with a structure which improves brightness efficiency and brightness uniformity and the structure of which is improved to prevent a Mura phenomenon and a display apparatus comprising the same.

The disclosure will be described in greater detail below with reference to the accompanied drawings.

Figure 1:
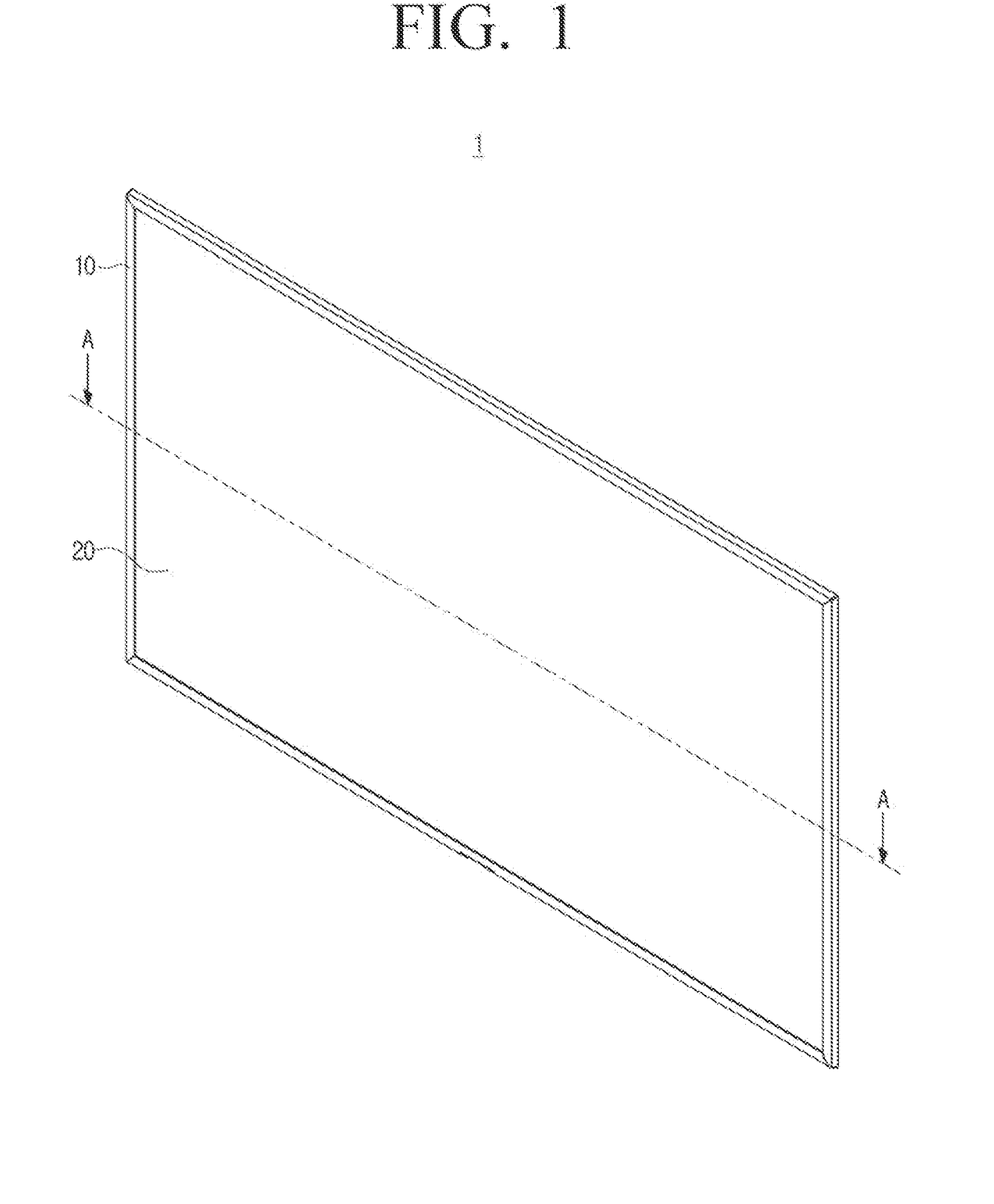
FIG. 1 is a perspective view of a display apparatus according to an embodiment of the disclosure.
Figure 2:
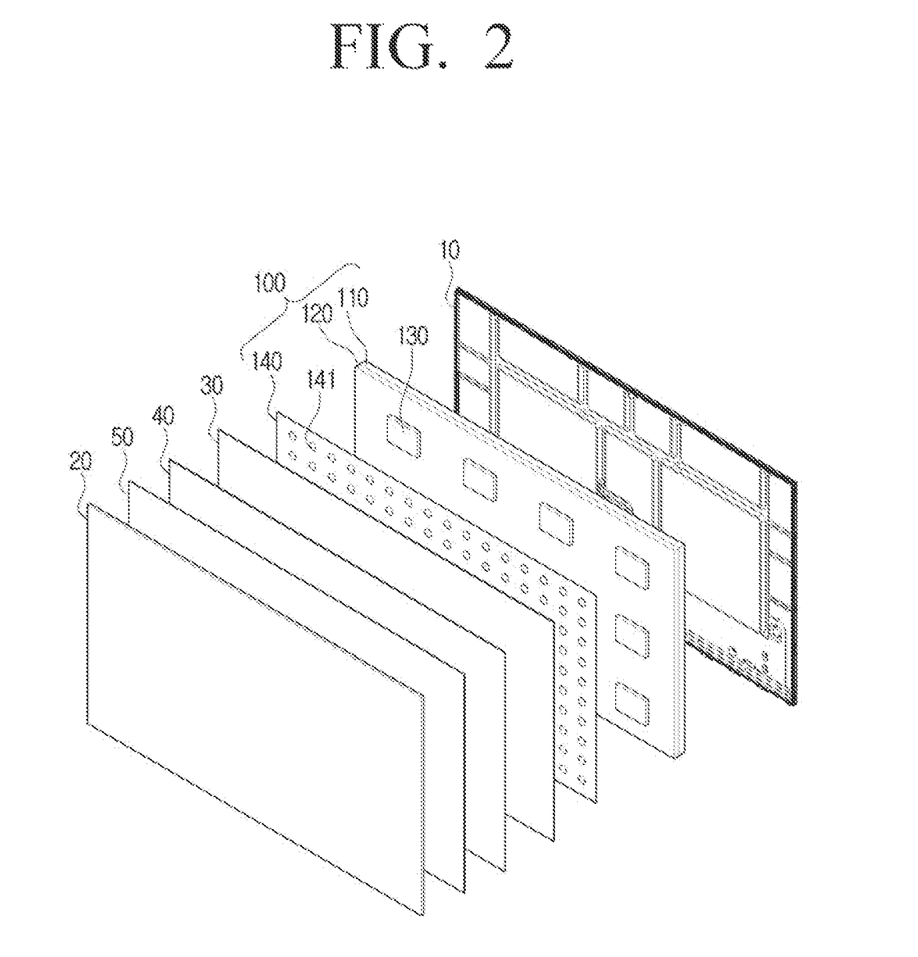
FIG. 2 is an exploded perspective view of a display apparatus according to an embodiment of the disclosure.

FIG. 1 is a perspective view of a display apparatus according to an embodiment of the disclosure. FIG. 2 is an exploded perspective view of a display apparatus.

Referring to FIG. 1 to FIG. 2, the display apparatus 1 may include a housing 10, a display panel 20, a diffusion sheet 30, a quantum dot sheet 40, an optical sheet 50, and a backlight unit 100.

The display apparatus 1 described below may process an image signal received from an outside, and as a device which can display the processed image visually, the device may be implemented in various forms such as, for example, and without limitation, a television, a monitor, a mobile multimedia device, a mobile communication device, or the like, and the form thereof may not limited so long as it is a device which can display an image visually.

The housing 10 may form an exterior of the display apparatus 1 by containing the display panel 20, the diffusion sheet 30, the quantum dot sheet 40, the optical sheet 50, and the backlight unit 100 inside. The housing 10 may include an opening at a front surface, and formed such that the front surface of the display panel 20 displaying an image is exposed to the outside.

The display panel 20 may display various images toward a front according to an image signal which is input from the outside, and may be configured as a liquid crystal display (LCD) panel. In addition, because the display panel 20 does not emit light on its own, light may be provided from the backlight unit 100.

The display panel 20 may include a color filter substrate (not shown) included with a color filter and a black matrix and a thin film transistor substrate (not shown) included with a plurality of thin film transistors, and liquid crystals (not shown) may be loaded between the color filter substrate and the thin film transistor substrate. Because the display panel 20 may use a liquid crystal panel of the related art, the detailed description thereof will be omitted.

The diffusion sheet 30 may be formed in a roughly rectangular flat panel shape having a size that corresponds to the display panel 20, and formed with a transmissive material which allows light to pass through. For example, the diffusion sheet 30 may be formed of a transparent plastic such as, for example, and without limitation, polymethyl methacrylate (PMMA), polycarbonate (PC), and the like.

The diffusion sheet 30 may distribute light output from a light source 130 uniformly, and expand a field of view by transferring the light to the quantum dot sheet 40, the optical sheet 50, and the display panel 20 and alleviate a hot spot, a bright line, a stain, and the like.

The quantum dot sheet 40 may be disposed between the display panel 20 and the backlight unit 100 and convert a wavelength of light. The quantum dot sheet 40 may include a quantum dot (QD) which can absorb light of various wavelengths and scatter to light of a desired wavelength. The quantum dot may be an inorganic crystal material or a micro-hole of less than or equal to several tens of nanometers (nm).

For example, if the light source 130 irradiates a blue color light, the light which passes through the quantum dot sheet may express a high color purity as the wavelength is variously changed according to the size of the quantum dot, and color reproducibility of an image which is realized in the display panel 20 may be enhanced.

The optical sheet 50 may be disposed between the display panel 20 and the quantum dot sheet 40 enhancing brightness of light and for light to be distributed evenly as light being wasted is minimized using refraction, reflection, and the like of light.

The optical sheet 50 may have a structure in which at least one from among a prism sheet (not shown), a protective sheet (not shown), and a double bright enhancement film (DBEF; not shown) is sequentially laminated.

The prism sheet and the double bright enhancement film may increase brightness by refracting or collecting light, and the protective sheet may protect the diffusion sheet, the prism sheet, the double bright enhancement film and components disposed inside the display apparatus 1 from external impact or foreign substances.

The backlight unit 100 may include a printed circuit board 110, a reflective layer 120, a light source 130, and a reflective sheet 140.

The printed circuit board 110 is shown in a rectangular plate form, but is not limited thereto, and may be formed in a bar shape with a narrow width and long length.

At one surface of the printed circuit board 110, a plurality of light sources 130 may be installed spaced apart at a certain distance. In addition, a power line (not shown) which provides power to the plurality of light sources 130 may be formed at the printed circuit board 110.

The reflective layer 120 may be disposed at one surface of the printed circuit board 110 to which the plurality of light sources 130 is disposed. The reflective layer 120 may include at least one from among photo solder resist (PSR), polyester terephthalate (PET), polycarbonate (PC), and polyester so as to have a high reflectivity.

The reflective layer 120 may reflect back a portion of light which is emitted from the light source 130 and light which is emitted from a lower surface of the reflective sheet 140 to an upper side. A pathway of light irradiated from the light source 130 will be described in detail below with reference to FIG. 3 to FIG. 4.

The light source 130 may include an LED chip and an encapsulant covering the LED chip. The encapsulant may be formed of at least one from among a transparent epoxy and silicon, and a reflective material such as TiO2 may be further included to prevent light generated from the LED chip from being absorbed or scattered in the encapsulant and dissipated.

The light source 130 may be formed in plurality and disposed spaced apart at a uniform pitch to irradiate light uniformly to an upper side of the printed circuit board. That is, the backlight unit 100 according to an embodiment of the disclosure may have a direct type structure.

The reflective sheet 140 may be disposed in a plate form at an upper part of the plurality of light sources and have a property of transmittance being different according to a light incident angle. That is, the reflective sheet 140 may be provided as an angular selective multi-reflection device.

The reflective sheet 140 may have a void 141 by which light is not reflected but allowed to pass through directly. As will be described below, the void 141 may be realized as a plurality of holes 141-1 (referring to FIG. 3) or as slit regions 141-2 (referring to FIG. 7) having a specific pattern, but is not limited thereto. The detailed shape and configuration of the reflective sheet 140 will be described below.

Figure 3:
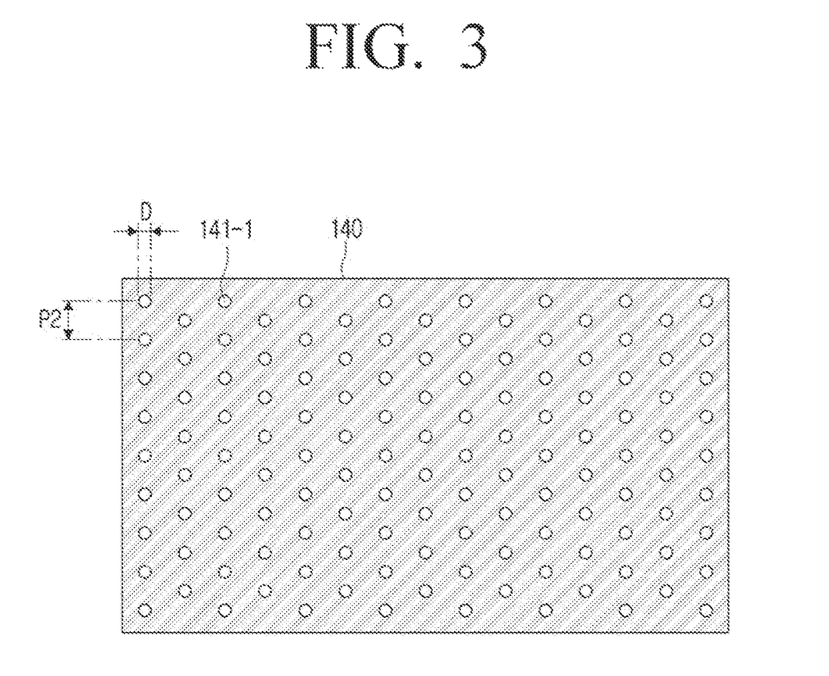
FIG. 3 is a top plan view of a reflective sheet having a plurality of holes according to an embodiment of the disclosure.
Figure 4:
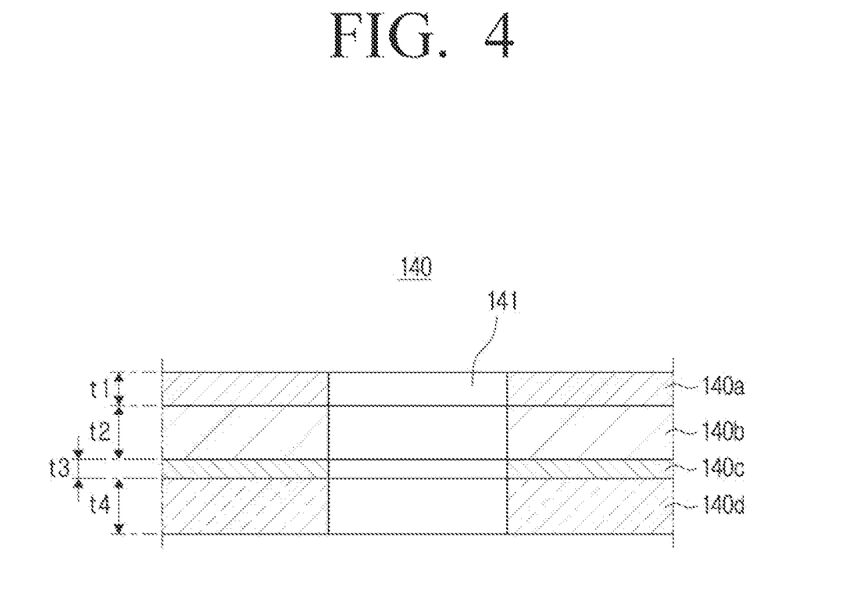
FIG. 4 is a cross-sectional view of a reflective sheet according to an embodiment of the disclosure.

FIG. 3 is a top plan view of a reflective sheet having a plurality of holes. FIG. 4 is a cross-sectional view of a reflective sheet according to an embodiment of the disclosure. Referring to FIG. 3 to FIG. 4, the reflective sheet 140 may be formed by laminating a plurality of thin films 140a, 140b, 140c, and 140d of which at least one from among a refractive index and thicknesses t1, t2, t3, and t4 is different.

Accordingly, the reflective sheet 140 may be configured such that reflectivity has a greater property than transmittance if the light incident angle is less than a preset value in accordance with Snell's Law. The above-described preset incident angle may be variously determined according to a refractive index and thickness of the plurality of thin films 140a, 140b, 140c, and 140d.

The reflective sheet 140 may be formed with the void 141 by which light is not reflected but allowed to pass through, and a total area of the void 141 may be greater than or equal to 5% and less than or equal to 50% based on an area of the reflective sheet 140.

The void 141 formed at the reflective sheet 140 may be realized as the plurality of holes 141-1 which passes through the reflective sheet 140.

A diameter of the plurality of holes 141-1 may be greater than or equal to 0.05 mm and less than or equal to 5 mm, and at least one from among the plurality of holes 141-1 may have a size different from other holes 141-1, but is not limited thereto, and may have various values according to a size of the light source 130 or a screen.

The plurality of holes 141-1 may be randomly disposed on the reflective sheet 140. However, the embodiment is not limited thereto, and the plurality of holes 141-1 may be disposed spaced part to have a certain pitch regularly.

The pitch between the plurality of holes 141-1 may be greater than or equal to 0.1 mm and less than or equal to 10 mm, but is not limited thereto, and may have various values according to a size of the pitch between the light sources 130 or the screen.

The plurality of holes 141-1 may be formed with greater than or equal to 24 holes at the reflective sheet 140, but the number is not limited thereto.

Figure 5:
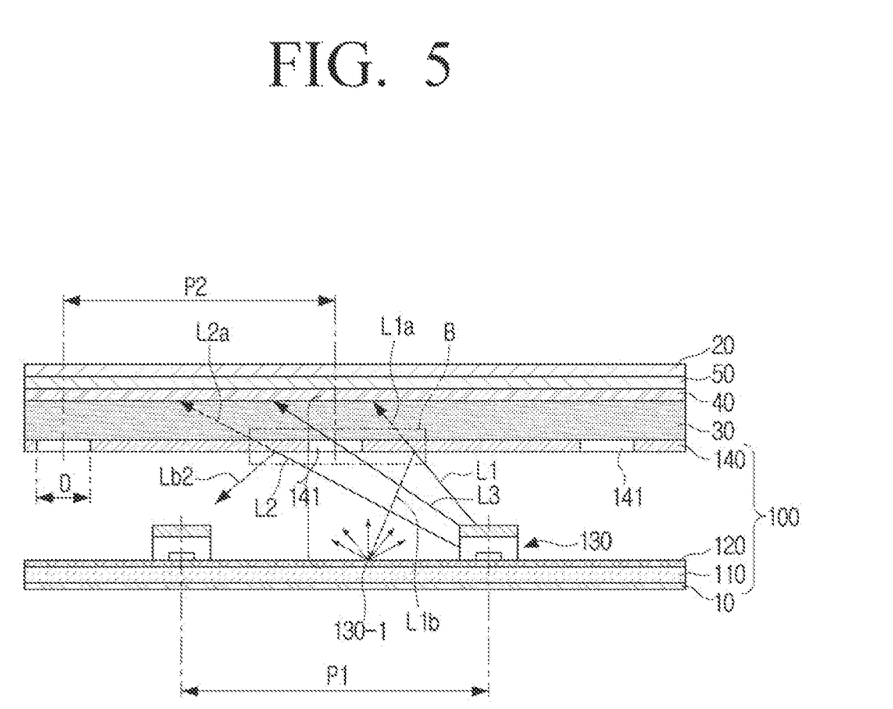
FIG. 5 is an enlarged cross-sectional view taken along A-A of FIG. 1 according to an embodiment of the disclosure.
Figure 6:
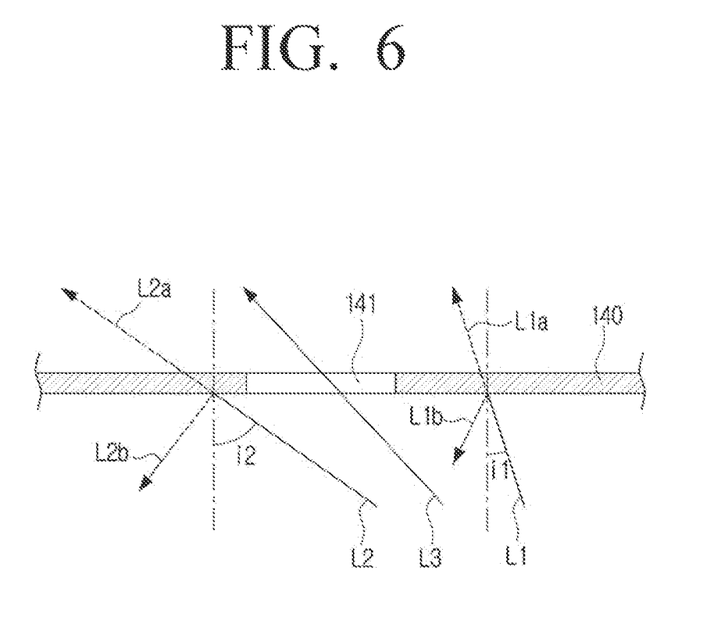
FIG. 6 is a cross-sectional view of an enlarged B portion of FIG. 5 according to an embodiment of the disclosure.

FIG. 5 is an enlarged cross-sectional view taken along A-A of FIG. 1. FIG. 6 is a cross-sectional view of an enlarged B portion of FIG. 5.

Referring to FIG. 5 to FIG. 6, the light source 130 may irradiate light toward an upper side at various angles. For example, the light source 130 may irradiate a first light to a third light L1, L2, and L3 which proceed in directions different from one another.

The first light L1 may be irradiated toward the reflective sheet 140 at a first incident angle i1. Then, a portion of the first light L1 may pass through the reflective sheet 140, and a portion may be reflected toward a lower side by the reflective sheet 140.

Likewise, a second light L2 may be irradiated toward the reflective sheet 140 at a second incident angle i2. Then, a portion of the second light L2 may pass through the reflective sheet 140, and a portion may be reflected toward the lower side by the reflective sheet 140. The second incident angle i2 may be greater than the first incident angle i1.

As described above, if the incident angle of light is less than a preset value, reflectivity may have a greater property than transmittance. Specifically, the reflective sheet 140 may be realized to have maximum reflectivity with respect to the light that is irradiated at a small incident angle from a region adjacent with the light source, and for transmittance to be higher as the incident angle is increased.

A threshold incident angle at which reflectivity of the reflective sheet 140 exceeds transmittance may be determined from a range of 0 degrees to 40 degrees, but is not limited thereto, and may be variously determined according to a manufacturing process of the reflective sheet 140.

That is, in the case of the first light L1 with a relatively small incident angle, an intensity of a first reflected light L1b may be greater than a first transmitted light L1a. Alternatively, in the case of a second light L2 with a relatively great incident angle, an intensity of a second transmitted light L2a may be greater than a second reflected light L2b.

Accordingly, the reflective sheet 140 may improve Mura according to the hot spot that is formed by light of small incident angle from a region adjacent to the light source 130.

The first reflected light L1b and the second reflected light L2b may be reflected toward the upper side again by the reflective layer 120. Then, light reflected back from the reflective layer 120 may form a virtual light source 130-1 between the plurality of light sources 130.

That is, as light which began from the light source 130 is repeatedly reflected by the reflective sheet 140 and the reflective layer 120, brightness uniformity may be improved from a gamut (or all range related to brightness) of the backlight unit 100.

The reflective sheet 140 may have at least one void 141 between two adjacent light sources from among the plurality of light sources 130. As described above, the void 141 may be realized as the plurality of holes 141-1, and a pitch P2 between the plurality of holes 141-1 may be smaller than a pitch P1 between the plurality of light sources 130. In addition, the number of the plurality of holes 141-1 may be greater than the number of the plurality of light sources 130.

A third light L3 may not be reflected by the reflective sheet 140 and may pass through the reflective sheet 140 through the void 141. For convenience of description, the third light L3 has been shown such that the incident angle is greater than the first incident angle i1 and smaller than the second incident angle i2, but is not limited thereto, and may be determined to various values according to a position of the void 141.

Based on the reflective sheet 140 reflecting most of the light of small incident angle, a dark spot with lesser brightness than a surrounding of a region that corresponds to the light source 130 from among the display panel 20 may be formed.

However, as light irradiated from the light source 130 is not reflected by the reflective sheet 140 and is passed through the void 141 formed at the reflective sheet 140, Mura according to the dark spot of the region adjacent to the light source 30 may be improved.

In addition, because light is not continuously reflected between the reflective sheet 140 and the reflective layer 120 and is passed through the void 141 after being reflected by a certain number of times, light loss according to multiple reflections may be minimized.

Figure 7:
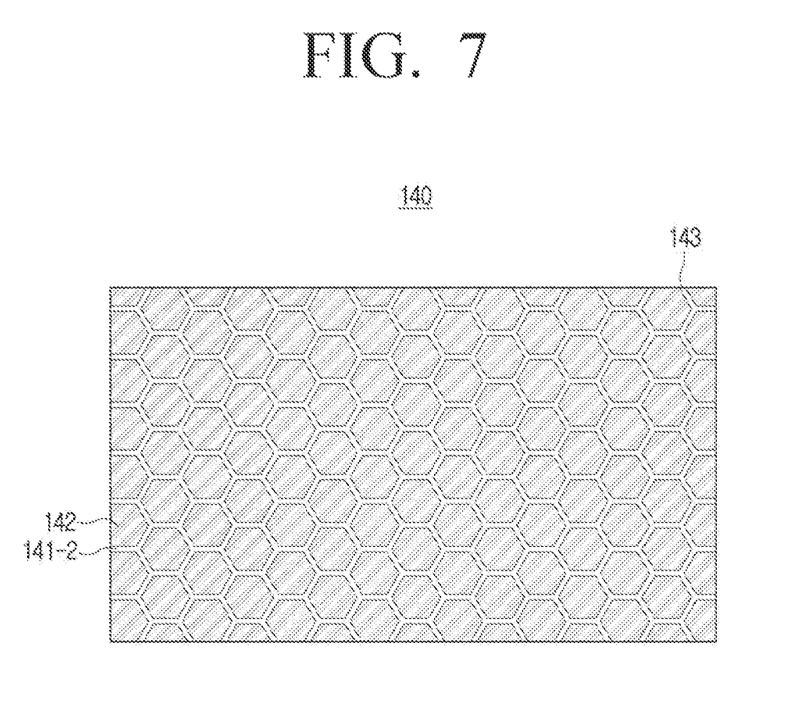
FIG. 7, FIG. 8 and FIG. 9 are top plan views of a reflective sheet having a reflection region and a slit region according to an embodiment of the disclosure.
Figure 8:
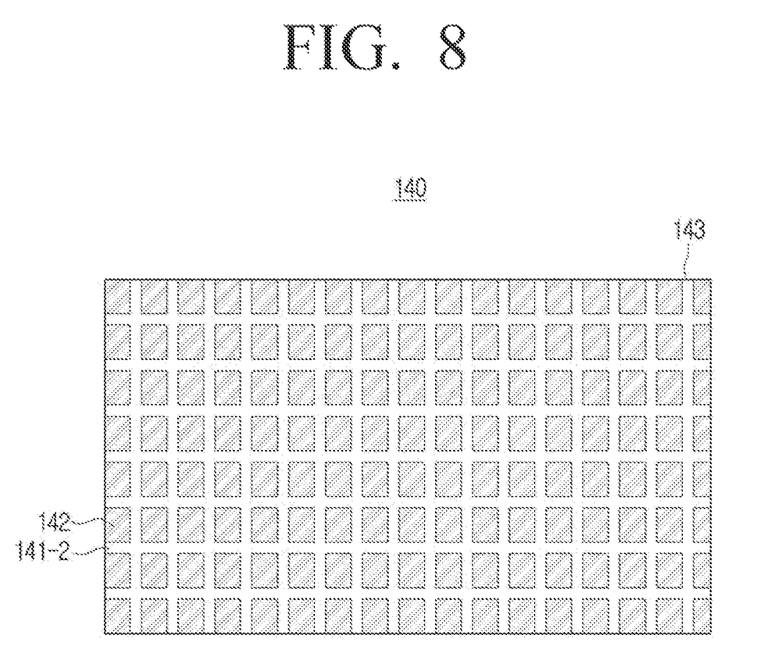
Figure 9:
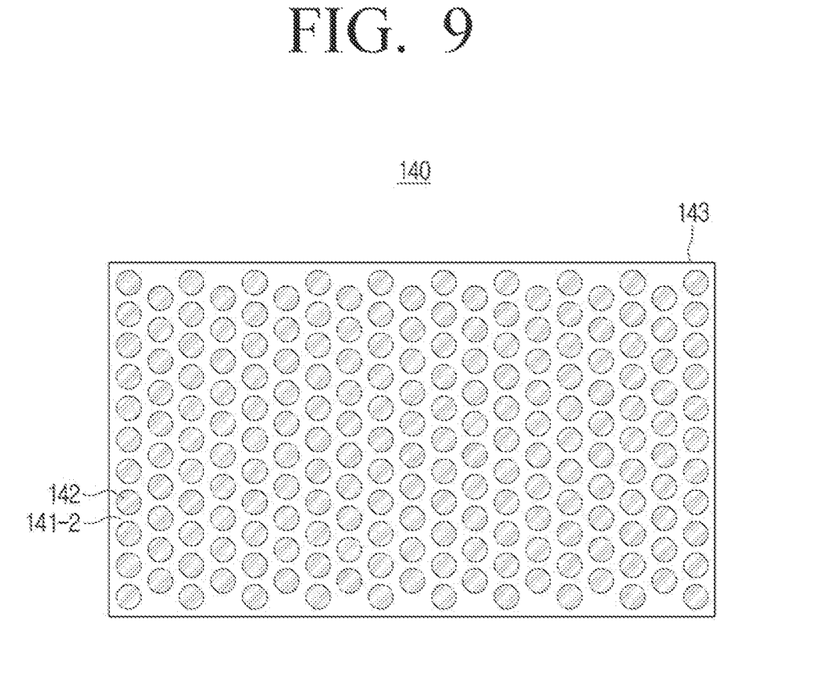
Figure 10:
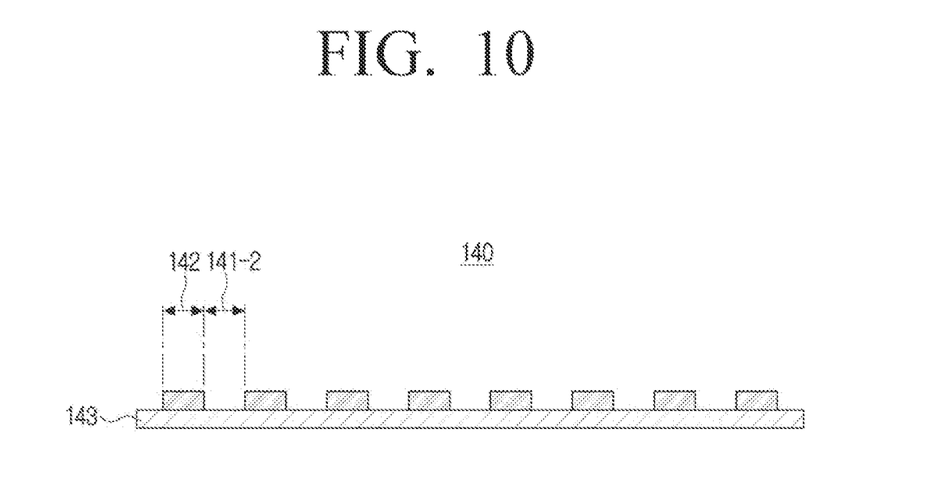
FIG. 10 is a cross-sectional view of a reflective sheet having a reflection region and a slit region according to an embodiment of the disclosure.

FIG. 7 to FIG. 9 are top plan views of a reflective sheet having a reflection region and a slit region. FIG. 10 is a cross-sectional view of a reflective sheet having a reflection region and a slit region.

Referring to FIG. 7 to FIG. 10, the reflective sheet 140 may have a plurality of reflection regions 142 with differing transmittance according to the light incident angle and a slit region 141-2 which is disposed between the plurality of reflection regions 142. In addition, the slit region 141-2 may have a pattern of at least one portion being disposed between two adjacent light sources 130 from among the plurality of light sources 130.

The pattern of the slit region 141-2 may be formed through a mold process at the reflective sheet 140, but is not limited thereto.

The plurality of reflection regions 142 may be divided by the slit region 141-2. The plurality of reflection regions 142 may have a polygonal shape such as a circle, a quadrangle, and a hexagon as shown in FIG. 7 to FIG. 9. However the shape of the reflection region 142 is not limited thereto.

The reflection region 142 divided by the slit region 141-2 may be formed with greater than or equal to 24 reflection regions at the reflective sheet 140, but is not limited thereto.

The reflective sheet 140 may include a polyethylene terephthalate (PET) film 143 which supports the plurality of reflection regions 142. The PET film 143 may be formed to be transparent so that light can pass through the slit region 141-2 without interference. The PET film 143 may have the divided reflection regions 142 laminated and fixed at one surface and disposed.

That is, as the void 141 by which light is allowed to pass through is appropriately realized as the plurality of holes 141-1 or the slit region 141-2 at the reflective sheet 140 having differing transmittance according to the incident angle, brightness uniformity may be improved and Mura may be improved as the hot spot and the dark spot are all removed.

In addition to the above, light loss which is generated according to light being repeatedly reflected between the reflective sheet 140 and the reflective layer 120 may be reduced, and light efficiency of the whole backlight unit 100 may also be increased.

While the disclosure has been illustrated and described with reference to various example embodiments thereof, it will be understood that the various example embodiments are intended to be illustrative, not limiting. It will be understood by those skilled in the art that various changes in form and details may be made therein without departing from the true spirit and full scope of the disclosure, including the appended claims and their equivalents.

What is claimed is:

1. A backlight unit, comprising:
   a printed circuit board;
   a plurality of light sources at a surface of the printed circuit board, the plurality of light sources to irradiate light;
   a reflective sheet that faces the plurality of light sources, the reflective sheet having differing transmittance according to a light incident angle of light from the plurality of light sources, respectively, and
   wherein the reflective sheet has at least one void between two adjacent light sources among the plurality of light sources, the at least one void being among a plurality of holes formed through the reflective sheet,
   wherein the plurality of holes are randomly disposed on the reflective sheet.

2. The backlight unit of claim 1, wherein a total area of the at least one void is greater than or equal to 5% and less than or equal to 50% of an area of the reflective sheet.

3. The backlight unit of claim 1, wherein at least one hole among the plurality of holes has a size different from at least another hole among the plurality of holes.

4. The backlight unit of claim 1, wherein a pitch between the plurality of holes is smaller than a pitch between the plurality of light sources.

5. The backlight unit of claim 1, wherein a number of the plurality of holes is greater than a number of the plurality of light sources.

6. The backlight unit of claim 1, wherein diameters of the plurality of holes are greater than or equal to 0.05 mm and less than or equal to 5 mm.

7. The backlight unit of claim 1, wherein a pitch between the plurality of holes is greater than or equal to 0.1 mm and less than or equal to 10 mm.

8. The backlight unit of claim 1, wherein,
   the reflective sheet has a plurality of reflection regions having a respective differing transmittance according to a respective light incident angle,
   the at least one void is a slit region between the plurality of reflection regions, and
   the slit region has a pattern whereby at least one portion is between the two adjacent light sources among the plurality of light sources.

9. The backlight unit of claim 8, wherein the plurality of reflection regions has a circular or a polygonal form.

10. The backlight unit of claim 8, wherein the reflective sheet comprises a polyethylene terephthalate (PET) film which supports the plurality of reflection regions.

11. The backlight unit of claim 1, wherein the reflective sheet has a reflectivity greater than a transmittance based on the light incident angle being less than a preset value.

12. The backlight unit of claim 1, wherein the printed circuit board has a reflective layer which reflects light toward an upper side of the surface on which the plurality of light sources are disposed.

13. A display apparatus, comprising:
   a display panel; and
   a backlight unit at a lower part of the display panel, wherein the backlight unit comprises:
      a printed circuit board;
      a plurality of light sources at a surface of the printed circuit board, the plurality of light sources to irradiate light; and
      a reflective sheet that faces the plurality of light sources, the reflective sheet having differing transmittance according to a light incident angle of light from the plurality of light sources,
   wherein the reflective sheet has at least one void between two adjacent light sources among the plurality of light sources, the at least one void being among a plurality of holes formed through the reflective sheet,
   wherein the plurality of holes are randomly disposed on the reflective sheet.

\* \* \* \* \*